United States Patent [19]

McFadyen

[11] 4,293,822

[45] Oct. 6, 1981

[54] GATED AGC AMPLIFIER WITH DC FEEDBACK

[75] Inventor: Robert J. McFadyen, Syracuse, N.Y.

[73] Assignee: General Electric Company, Syracuse, N.Y.

[21] Appl. No.: 93,098

[22] Filed: Nov. 9, 1979

[51] Int. Cl.³ .......................... H03F 3/45; H03G 3/30
[52] U.S. Cl. .................................. 330/254; 330/257; 330/259
[58] Field of Search ................. 330/254, 257, 259, 96, 330/261; 358/178

[56] References Cited
U.S. PATENT DOCUMENTS 4,172,238 10/1979 Kusakade .......................... 330/259

Primary Examiner—James B. Mullins
Attorney, Agent, or Firm—Richard V. Lang; Carl W. Baker

[57] ABSTRACT

A gated multiple stage AGC amplifier circuit comprising a differentially connected transistor pair in each stage and employing a dc feedback network for maintaining a balanced current conduction in the transistors of each transistor pair for achieving maximum gain and dynamic range throughout the gated operation. The dc feedback network includes a bias capacitor, a dc bus coupling a dc bias voltage across the capacitor to each transistor pair, and bias control means responsive to transistor current conduction for supplying charge and discharge currents that are made equal to each other for maintaining a stable dc bias voltage across said bias capacitor that results in said balanced current conduction, said bias control means exhibiting impedance characteristics that maintain said stable bias voltage throughout the gated amplifier operation. The invention has particular application to the receiver of a pulse echo system wherein the amplifier is gated "on" to correspond with received echo pulses.

17 Claims, 3 Drawing Figures

GATED AGC AMPLIFIER WITH DC FEEDBACK

BACKGROUND OF THE INVENTION

The invention pertains to AGC amplifier circuits and more particularly to multiple stage AGC amplifier circuits having a differentially connected transistor pair in each stage and possessing dc feedback for providing optimum amplifier gain and AGC characteristics.

These circuits commonly employ a relatively simple resistive feedback connection for applying the requisite balancing dc bias voltage to the transistors of each transistor pair. An amplifier circuit of this form is disclosed in U.S. Pat. No. 3,396,750, entitled, "AM-FM Receiver Having Improved Bias Supply Circuit", William Peil and Robert J. McFadyen, issued Feb. 3, 1976. The circuit with a resistive dc feedback connection will maintain the proper bias and perform admirably for a continuously operated amplifier. However, there are numerous applications in which a gated amplifier operation is desirable. One such application is in an intrusion alarm system disclosed in a copending application for U.S. Letters Patent entitled "Ultrasonic Intrusion Alarm System", the invention of Robert J. McFadyen and John Zeigler, filed concurrently with the present patent application and assigned to the same assignee. Neither the referred to resistive dc feedback circuit nor any other known dc feedback connection is suitable for a gated amplifier operation because the requisite stable dc bias voltage cannot be continuously maintained from one gated "on" period to the next. The present invention overcomes this limitation of the prior art circuits.

SUMMARY OF THE INVENTION

It is accordingly an object of the invention to provide a novel amplifier circuit with a dc feedback connection for achieving stability of operation and optimum gain characteristics, which circuit can be operated in a gated mode of operation while maintaining a stable dc bias voltage.

It is another object of the invention to provide a novel amplifier circuit as described which is characterized by an AGC capability.

It is still another object of the present invention to provide a novel AGC amplifier circuit as described that is composed of several amplification stages in a cascade arrangement, each comprising a differentially connected pair of transistors.

It is a further object of the invention to provide a novel gated AGC amplifier circuit as described that is adaptable to IC fabrication.

These and other objects of the invention are accomplished with respect to a gated AGC amplifier circuit comprising multiple amplification stages in a cascade arrangement, each stage including a differentially connected pair of first and second transistors connected to a current source transistor, with input means applying an ac input signal to the first transistor of the input stage. In accordance with one aspect of the invention, the amplifier circuit further comprises a dc feedback network including an ac bypass capacitor across which is established a dc bias voltage, a dc bus coupling the dc bias voltage across said capacitor to the second transistor of each stage for providing a balanced current conductor in each amplification stage for optimum amplifier gain and AGC characteristics, and dc bias control means responsive to current flowing in the output stage for generating capacitor charge and discharge currents which when made equal to each other provide a stable dc bias voltage that results in said balanced current conduction. The bias control means is constructed to present a pair of current sources to the bias capacitor during periods when the amplifier circuit is gated "on", and a high impedance to said capacitor during periods when said amplifier circuit is gated "off" so as to maintain the stable dc bias voltage throughout the gated amplifier operation.

In accordance with a further aspect of the invention, the bias control means includes a first current path with a first semiconductor current mirror coupled to the first differentially connected transistor of the output stage for conducting the charge current with a value substantially equal to the current flowing in said first transistor, and including a second current path with a second semiconductor current mirror coupled to the second differentially connected transistor of the output stage for conducting the discharge current with a value substantially equal to the current flowing in said second transistor, whereby a dc bias voltage is established across the capacitor that maintains equal current flow in the first and second differentially connected transistors of each stage.

In accordance with another aspect of the invention, a gated AGC control signal is applied to the current source transistors of each stage for controlling the transconductance of each stage and for controlling the gated "on-off" operation of the amplifier circuit.

BRIEF DESCRIPTION OF THE DRAWINGS

While the specification concludes with the claims which particularly point out and distinctly claim that subject matter which is regarded as inventive, it is believed the invention will be more clearly understood when considering the following detailed description taken in connection with the accompanying figures of the drawings, in which:

DESCRIPTION OF A PREFERRED EMBODIMENT

Figure 1:
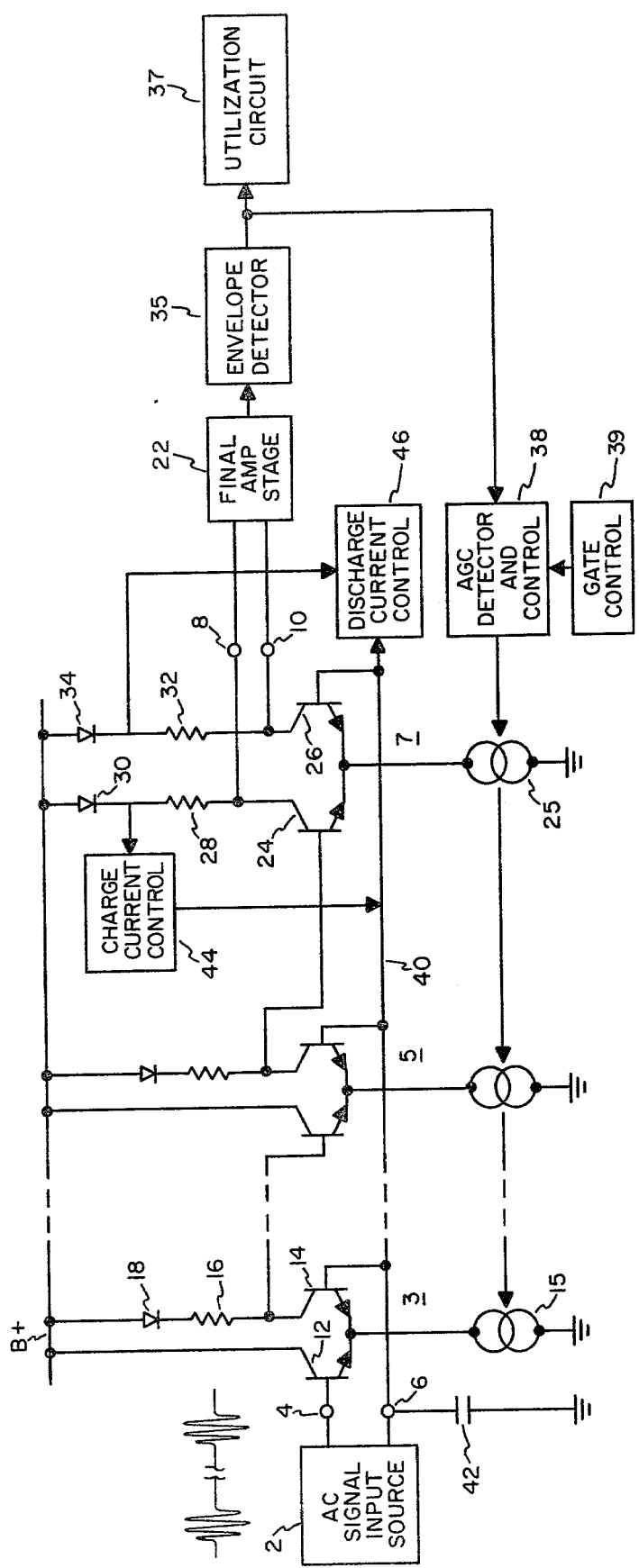
FIG. 1 is a simplified schematic circuit-block diagram of a gated AGC amplifier circuit, in accordance with the invention.

With reference to FIG. 1, there is illustrated a simplified schematic circuit-block diagram of a gated AGC amplifier circuit for amplifying an ac signal applied from an ac signal input source 2 to input terminals 4 and 6 of input stage 3 of the amplifier circuit. In an exemplary embodiment of the invention wherein the amplifier circuit was employed in a pulse echo intrusion alarm system, the subject of the aforementioned copending patent application, the input signal was a pulsed waveform comprising several cycles of an approximately 30 KHz carrier frequency at a pulse repetition rate of 15 Hz. The circuit, which is adaptable to IC fabrication, comprises a multiplicity of gain controlled amplification stages connected in a cascade arrangement, each having a pair of differentially connected transistors driven by a current source for controlling the transconductance, gm, of each stage. For purposes of simplicity only three stages, 3, 5 and 7, are illustrated in FIG. 1, with the output of the gain controlled circuit being taken from output stage 7 at terminals 8 and 10. All stages preceding the output stage 7 are of identical circuit configuration and the components thereof have matching properties to one another and to the compounds of the output stage. As shown with respect to the input stage 3, a pair of first and second differentially connected NPN transistors 12 and 14 have their emitters joined and coupled to a schematically illustrated current source 15, the collector of transistor 12 connected directly to a B+ supply and the collector of transistor 14 coupled through the series connection of a resistor 16 and a diode 18 to the B+ supply. Diode 18 is poled to conduct current in the forward direction to the collector of transistor 14. The base of transistor 12 is coupled to input terminal 4 and the collector of transistor 14, from which a single ended output of the first stage is taken, is coupled to the base of the succeeding stage for supplying an input thereto. In FIG. 1 this connection is shown by a broken line so as to indicate the existence of additional stages like stages 3 and 5 for possible inclusion in the amplifier circuit.

The output stage 7 is in a balanced circuit configuration and provides a differential output connection to a final amplification stage 22 of constant gain, shown in block form. Stage 22 is a conventional amplifier component employed to increase the overall gain of the amplifier for achieving a desired signal amplitude at the output while permitting the transistors of the controllable gain stages 3 through 7 to be operated well within their linear region. The output stage includes a pair of first and second differentially connected NPN transistors 24 and 26 having their emitters joined and coupled to a current source 25, which is identical to current source 15 so that the current sources in each stage supply the same currents. The collector of transistor 24 is coupled through the serial connection of a resistor 28 and a forward poled diode 30 to the B+ supply. Correspondingly, the collector of transistor 26 is coupled through the serial connection of a resistor 32 and a forward poled diode 34 to the B+ supply. The base of transistor 24 is connected to the collector of the second transistor of the preceding stage 5 for signal coupling to the output stage, whose output is taken from the collectors of transistors 24 and 26 that are respectively coupled to terminals 8 and 10 for supplying a signal to final amplification stage 22. The output of stage 22 is coupled to an envelope detector 35. The amplifier output may be taken from envelope detector 35 and applied to a utilization circuit 37 for performing a particular function. In the referred to exemplary embodiment of the invention in a pulse echo intrusion alarm system, this circuit included means responsive to the envelope detected amplified signal for causing the sounding of an audible alarm under certain signal conditions. A complte disclosure of this system is contained in the aforementioned copending patent application.

An AGC and gated control operation of the amplifier circuit is provided by gated control signals from an AGC detector and control means 38 having an input coupled from envelope detector 35 for providing AGC control signals as a function of the amplified output. The AGC control signals are gated by gate control means 39 and applied to control the current in current sources 15 and 25. Sources 38 and 39 are generally illustrated in block form, their circuit details being provided in FIG. 2.

A dc feedback network primarily including a dc bus 40, an ac coupling capacitor 42, charge current network 44, and discharge current network 46, in accordance with the invention provide a stabilized dc bias voltage to each gain controlled amplification stage that will maintain a balanced current conduction within each transistor pair for ensuring optimum gain and dynamic range characteristics for the circuit in the presence of a gated AGC operation. The bus 40 is connected to input terminal 6, which is coupled through capacitor 42 to ground. A dc bias voltage developed across the capacitor is applied by bus 40 to the bases of the second differentially connected transistors of each stage, as shown by the connection to the bases of transistors 14 and 26. Charge current network 44 and discharge current network 46, illustrated in block form in FIG. 1 and to be described in detail when considering FIG. 2, form dc bias control means for controlling the dc bias voltage across capacitor 42. Charge current network 44 senses the collector current in the first transistor 24 of output stage 7 for supplying a related current, typically of approximate equality to the sensed collector current, for charging capacitor 42. Discharge current network 46 senses the collector current in the second transistor 26 for supplying a related discharge current, also typically of approximate equality to the sensed collector current, for discharging the capacitor. The charge and discharge currents are made equal to each other for the condition in which the collector currents in transistors 24 and 26 are equal, so as to establish a constant dc bias voltage which maintains a balanced current between the differentially connected transistors in the output stage and also in all preceding stages in the presence of an applied ac signal.

With respect to the operation of the gated AGC amplifier circuit of FIG. 1, consider first the case when no ac signal is applied to input terminals 4 and 6 and the amplifier is gated "on". The current sources 15 and 25 supply equal currents in each stage, the value of which is determined by the AGC control signal from detector and AGC control means 38. The second differentially connected transistor in each stage is biased by the dc bias voltage across capacitor 42 and the first differentially connected transistor in each stage, other than the first which is also biased by the capacitor voltage, is biased by the collector voltage of the preceding stage. With a proper dc bias voltage established across capacitor 42, the currents will divide equally in the differentially connected transistors of each stage. The voltage across the capacitor 42 is determined by the relationship of the charge current generated by charge current network 44 to the discharge current generated by discharge current network 46. Should the charge current be greater than the discharge current the bias voltage increases, and should the charge current be less than the discharge current, the bias voltage decreases. Since the charge and discharge currents are responsive to the collector currents in transistors 24 and 26, the bias voltage is thereby forced to attain a stable value that provides equal current conduction in transistors 24 and 26 and also in the differentially connected transistors of the preceding stages.

With an ac signal applied and the amplifier gated "on", current within each amplification stage is steered from one differentially connected transistor to the other as a function of said ac signal. While the charge and discharge currents correspondingly vary at the ac signal frequency, which in an exemplary operation has been indicated to be in the order of 30 kilohertz, capacitor 42 is sufficiently large so that the voltage across it will be essentially unchanged if these currents are equal. So long as the dc bias voltage across capacitor 42 remains of proper value, there will be a balanced current conduction in the differentially connected transistors of each stage. This ensures maximum amplifier gain and maximum dynamic range over the entire AGC characteristic. In the present example, there was achieved a dynamic range of 50 db for the input signal for an output signal within 3 db. If it is assumed that the ac input signal is initially a small signal with the gain as set by the detector and AGC control means 38 relatively high, the proper dc bias voltage is of relatively low value. Should the ac input signal increase in amplitude which produces a reduction in amplifier gain, the dc bias voltage automatically re-establishes itself at a new value that will continue to provide balanced currents in the transistor pair of each stage. In this example, the new dc bias voltage will be increased from the initially considered value.

The automatic re-establishment of the dc bias voltage may be explained as follows: A reduced amplifier gain is achieved by a reduced current in the current sources of each stage which increases the collector dc bias voltage applied to the base of the first transistor of each stage. Thus, for a brief time, current in the first transistor of each stage will exceed current in the second transistor. Considering output stage 7, this temporary imbalance in current between transistors 24 and 26 produces a charge current in network 44 that exceeds the discharge current in network 46, which in accordance with the time constant of the circuit acts to rapidly increase the voltage across capacitor 42 to a new value that once more provides a balanced current conduction in the transistor pair of each stage.

Correspondingly, should the ac input signal decrease in amplitude, an increase in amplifier gain by virtue of the AGC operation will result. This is achieved by an increased current source current which reduces the collector dc bias voltage supplied to the first transistors, and for a brief time current in the first transistor of each stage will be less than the current in the second transistor. This temporary imbalance in current between transistors 24 and 26 in output stage produces a discharge current in network 46 that exceeds the charge current in network 44, which acts to rapidly reduce the voltage across capacitor 42 to a value that again provides balanced current conduction in the transistor pair of each stage.

Gated operation of the amplifier circuit is provided by gate control means 39 which applies a gate control signal to AGC control means 38 for gating "on" and "off" the AGC signal and, therefore, the current sources which are shown at 15 and 25. For purposes of the invention, the gate control signal serves to control the "on-off" operation of the amplifier as may be required by whatever constraints are imposed by the system in which the amplifier is employed. In the exemplary embodiment under consideration, the gating operation is designed to gate the amplifier on for times corresponding to the presence of the input pulsed signals and to gate the amplifier "off" during intervening times. As will be described more completely when considering FIG. 2, charge current network 44 and discharge current network 46 comprise semiconductor components which when the amplifier circuit is in the gated "on" state provide current paths for capacitor 42 through a pair of pushpull current sources. When the amplifier circuit is in the gated "off" state, these components provide high impedance current paths for said capacitor for holding the charge and maintaining a stable dc bias voltage for the amplifier circuit throughout its gated "on-off" operation.

Figure 2:
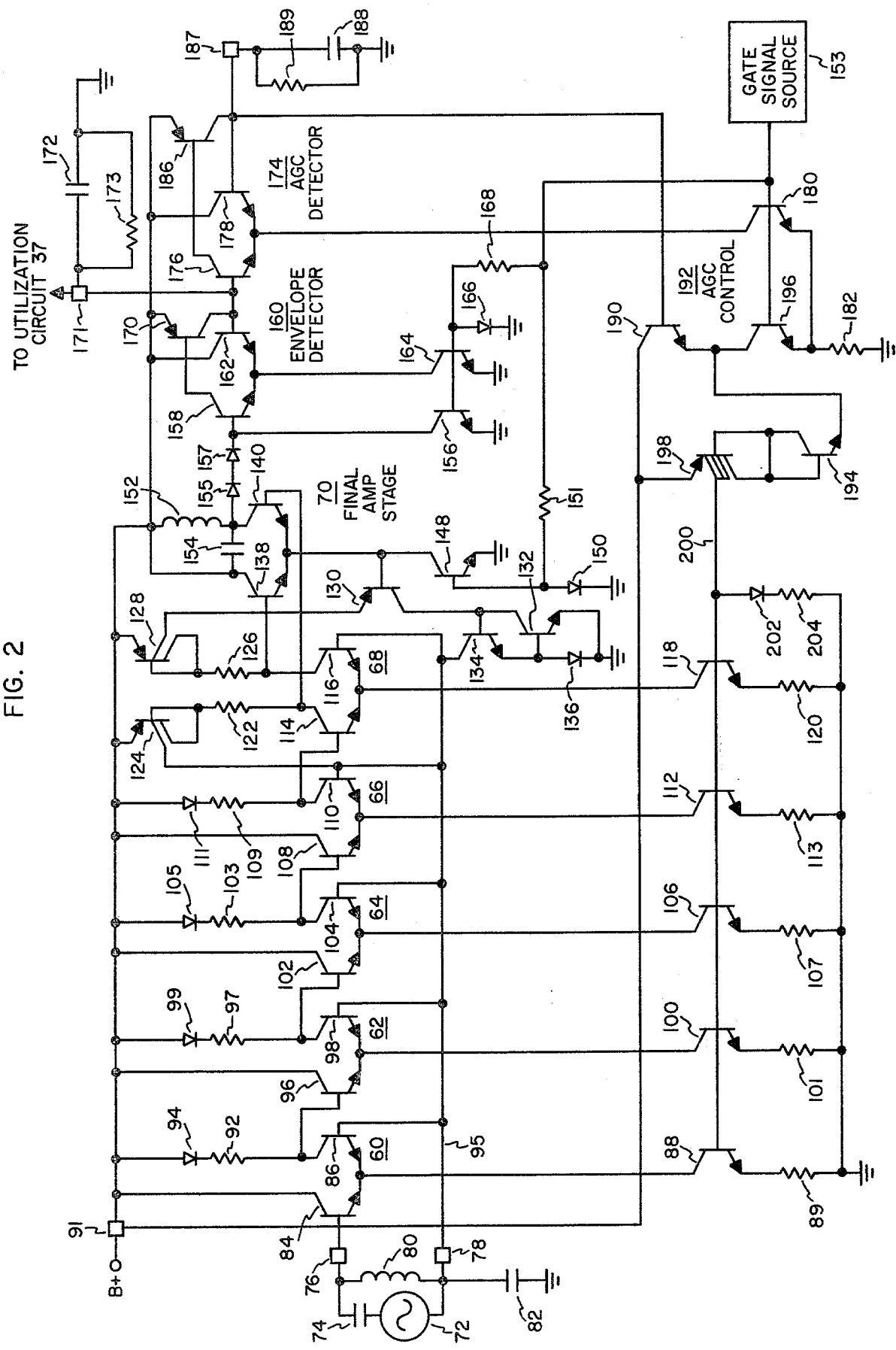
FIG. 2 is a more complete schematic circuit diagram of the gated AGC amplifier circuit of FIG. 1.

Referring now to the detailed schematic circuit diagram of FIG. 2, the gated AGC amplifier of IC construction is seen to comprise five stages of controllable gain, namely, input stage 60, intermediate stages 62, 64 and 66, and output stage 68. In addition, the amplifier includes a final stage 70 of constant gain for increasing the overall gain of the amplifier and avoiding a limiting condition in any of the transistors of the controllable gain stages. An ac signal source generator 72, external to the amplifier IC, is connected at one terminal through an ac coupling capacitor 74 to a first input terminal at pad 76 of the IC amplifier circuit, and has its other terminal connected to a second input terminal at pad 78. A dc coupling inductor 80 is connected between the input pads and an ac coupling capacitor 82, across which is developed a dc bias voltage, is connected between pad 78 and ground. Input stage 60 comprises a pair of differentially connected NPN transistors 84 and 86, the emitters of which are joined and connected to the collector of a current source NPN transistor 88. The emitter of transistor 88 is connected through a current determining resistor 89 to ground. The collector of the first differentially connected transistor 84 is coupled directly to a pad 91 which is coupled to a source of B+ supply, and the collector of the second differentially connected transistor 86 is coupled through the serial connection of a resistor 92 and forward conduction poled diode 94 to pad 91. The base of transistor 84 is connected to pad 76 and that of transistor 86 is connected to a dc bus 95 which is coupled to input pad 78 and also to the bases of the second differentially connected transistors of stages 62, 64, 66 and 68. The collector of transistor 86 provides a single ended output from the first stage 60. Current source transistor 88 is AGC and gate controlled, as are the current source transistors of the remaining gain controlled stages, the circuit for which will be subsequently described in greater detail.

Stage 62 includes first and second differentially connected NPN transistors 96 and 98, respectively, the output from stage 60 being connected to the base of transistor 96 for applying an input to the second stage. The collector of transistor 96 is coupled directly to pad 91 and the collector of transistor 98 is coupled through the serial connection of a resistor 97 and a forward conduction poled diode 99 to pad 91. The collector of transistor 98 provides a single ended output connection to the succeeding stage 64. Transistors 96 and 98, having their emitters joined, are supplied with current by a current source NPN transistor 100 whose emitter is connected through a current determining resistor 101 to ground.

Stage 64 includes a pair of differentially connected NPN transistors 102 and 104, the serial connection of resistor 103 and diode 105 in the collector circuit of transistor 104, a current source NPN transistor 106 and a current determining resistor 107. Stage 66 includes a pair of differentially connected NPN transistors 108 and 110, the serial connection of a resistor 109 and diode 111 in the collector circuit of transistor 110, a current source NPN transistor 112 and a current determining resistor 113. The transistor, resistor and diode components of stages 64 and 66 are in an identical circuit configuration as described with respect to stages 60 and 62 and are of matching characteristics with corresponding components of these stages and also with corresponding components of output stage 68. A single ended output is taken from the collector of transistor 104 of stage 64 and coupled to the base of transistor 108 of stage 66 for supplying its input, and a single ended output is taken from the collector of transistor 110 of stage 66 and coupled to the base of the first differentially connected NPN transistor 114 of output stage 68 for supplying the input to this stage.

Figure 3:
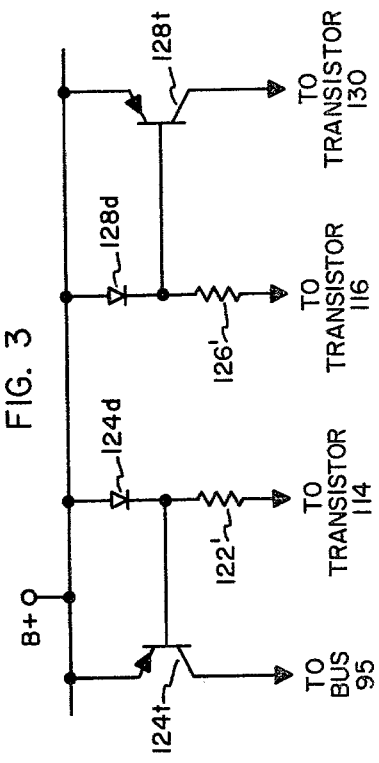
FIG. 3 is an alternate circuit configuration for a portion of the circuit of FIG. 2.

Output stage 68 includes a second differentially connected NPN transistor 116, transistors 114 and 116 being connected in a balanced circuit configuration and providing a differential output to the final amplification stage 70. The emitters of transistors 114 and 116 are joined and coupled to the collector of a current source NPN transistor 118, the emitter of which is connected through a current determining resistor 120 to ground. The collector of transistor 114 is connected through a resistor 122 to the junction of the base and a first collector of a current mirror PNP transistor 124, the emitter of which is connected to pad 91. The second collector of transistor 124 is connected to bus 95. Transistor 124, which provides a diode connection in the collector circuit of transistor 114, is constructed so as to generate substantially equal current flow in the first and second collectors thereof so that current flowing from its second collector is equal to current in the collector circuit of transistor 114. An alternate circuit configuration for that of transistor 124 is illustrated in FIG. 3, which includes a diode 124d coupled from a B+ bus to resistor 122 in parallel with the base emitter junction of transistor 124f. The diode junction and base-emitter junction are of equal geometry to provide equal current flow to bus 95 and to transistor 114.

The collector of transistor 116 is connected through a resistor 126 to the junction of the base and a first collector of a second current mirror PNP transistor 128, the emitter of which is connected to pad 91. The second collector of transistor 128 is coupled to the emitter of a cascode connected PNP transistor 130. Similar to transistor 124, transistor 128 provides a diode connection in the collector circuit of transistor 116 and is constructed to generate substantially equal currents in its first and second collectors so that current flowing in transistor 130 is substantially equal to current in the collector circuit of transistor 116. An alternate circuit configuration for transistor 128 is illustrated in FIG. 3, including diode 128d coupled in parallel with the base-emitter junction of transistor 128t. Equal function geometries provide equal current flow.

The collector of transistor 130 is coupled to the collector of an NPN transistor 132 and to the base of a further NPN transistor 134 which is also of cascode connection. The emitter of transistor 132 is coupled to ground. Its base is coupled through a forward conduction poled diode 136 to ground and to the emitter of transistor 134, the collector of which is connected to bus 95. Transistors 132 and 134 are arranged in a "Wilson" circuit and provide a further current mirror operation whereby the current flowing in transistor 130 is substantially equal to current flowing in transistor 134, which is the discharge current for capacitor 82. The cascode connection of transistor 130 absorbs the major portion of the supply voltage and ensures that the collector to emitter voltage of transistor 128 will equal that of transistor 124 so equal currents can flow in these transistors. The cascode connection of transistor 134 allows development of the requisite voltage across capacitor 82 for proper operation of the circuit.

The output of output stage 68 is taken from the collectors of transistors 114 and 116 which are coupled, respectively, to the base of differentially connected NPN transistors 138 and 140 of final amplifier stage 70. Stage 70 is a conventional circuit of constant gain employed to provide a desired overall amplifier gain while permitting the differentially connected transistors of the controllable gain stages to operate well within their limiting conditions. The emitters of transistors 138 and 140 are joined and connected to the collector of current source NPN transistor 148, whose emitter is coupled to ground. Transistor 148 provides a constant current that is gated "on-off" as controlled by a diode 150 coupled across the base-emitter junction of transistor 148 and through a bias resistor 151 to a gate signal source 153. Gate source 153 selectively supplies an enabling voltage of a first voltage level $V_1$ for "on" and a disabling voltage of a second voltage level $V_o$, typically ground, for "off" operation. Resistor 151 determines the current flowing in diode 150 and therefore in current source transistor 148. The collector of transistor 138 is coupled directly to pad 91, and the collector of transistor 140 is coupled through a parallel tuned circuit of inductor 152 and capacitor 154 to pad 91, the tuned circuit being tuned to the ac carrier frequency.

The collector of transistor 140 provides the output of final amplifier stage 70 and is coupled through a pair of serially connected forward poled diodes 155 and 157 and a current source NPN transistor 156 to ground and to the base of a first differentially connected NPN transistor 158 of an envelope detector network 160 for supplying an input thereto. Envelope detector 160, which is a conventional circuit, also includes a second differentially connected NPN transistor 162. The joined emitters of transistors 158 and 162 are coupled to a current source NPN transistor 164 whose current is controlled by a diode 166 coupled across its base-emitter junction and through a current bias resistor 168 to gate signal source 153. The collector of transistor 158 is coupled to the base of an output PNP transistor 170, whose emitter is coupled to pad 91. The collector of transistor 170 is coupled to a pad 171 and to the base of transistor 162, the collector of which is coupled to pad 91. Pad 171 is coupled through an RC network external to the IC, including capacitor 172 and resistor 173, to ground. With a particular time constant assigned to the RC network, envelope detector 160 serves to detect the envelope of the amplified ac signal appearing at the output of final amplifier stage 70. Briefly, should the signal at the base of transistor 158 rise, current is increased in this transistor which reduces current in transistor 162 and increases current in transistor 170. This charges the capacitor 172 and causes the voltage across it to follow the rise in input signal. Should the signal at the base of transistor 158 fall, current in this transistor decreases, that of transistor 162 increases and of transistor 170 decreases, causing capacitor 172 to discharge into resistor 173 and the voltage across it to follow the fall in input signal.

The envelope detector output at pad 171, to which the utilization circuit may be tied, is coupled to an AGC detector network 174 which is of similar circuit configuration to detector 160, including a pair of differentially connected NPN transistors 176 and 178, the joined emitters of which are coupled to the collector of a current source NPN transistor 180, whose emitter is coupled through a current determining resistor 182 to ground and whose base is connected to gate signal source 153. An output PNP transistor 186 is coupled to a pad 187 that is coupled through a second RC network, including capacitor 188 and resistor 189, to ground. The AGC detector network 174 operates in similar fashion to network 160, with the time constant assigned to its RC network causing capacitor 188 to hold the peak voltage of the envelope detected waveform. Accordingly, in conventional manner an AGC voltage is developed across capacitor 188 that is greater or less than a mean value as a function of input signal strength.

The voltage across capacitor 188 is applied to the base of a first differentially connected NPN transistor 190 of an AGC control network 192, which also includes second differentially connected NPN transistor 194. The joined emitters of transistors 190 and 194 are coupled to a current source NPN transistor 196 having its base and emitter joined to the base and emitter, respectively, of transistor 180 so as to supply the same current as transistor 180. The collector of transistor 190 is coupled directly to pad 91, and the collector and base of transistor 194 are joined and coupled to the junction of the base and first collector of a four collector current mirror PNP transistor 198, the emitter of which is connected to pad 91. Thus, transistor 194 is connected as a diode, as is that portion of transistor 198 including its emitter, base and first collector. The remaining collectors of transistor 198 are joined and coupled to a conductor 200 which is coupled through the serial connection of a forward conduction poled diode 202 and resistor 204 to ground and to each of the bases of the current source transistors 88, 100, 106, 112 and 118 for controlling the gated "on-off" AGC operation of the gain controlled amplifier stages. Transistor 198 is constructed so as to generate equal current flow in each of its collectors so that the AGC current supplied to conductor 200 is three times the current flowing in the collector circuit of transistor 194.

Briefly, current flowing in transistors 194 and 198, and hence the trebled current supplied to conductor 200, is inversely related to the AGC voltage across capacitor 188 that is applied to the base of transistor 190. Thus, as the AGC voltage exceeds its mean value in response to relatively strong input signals, current supplied to transistor 190 is increased and is decreased to conductor 200. This serves to reduce the current in diode 202 and resistor 204 and therefore the voltage at the bases of current source transistors 88, 100, 106, 112 and 118 for reducing the current therein. Reducing the current in the current sources accordingly reduces the gm or gain of each gain controlled stage as a function of the AGC voltage. Conversely, as the AGC voltage falls below its mean value in response to relatively weak input signals, current supplied to transistor 190 is decreased and is increased to conductor 200. This serves to increase the current in the current source transistors so as to increase the gm or gain of each gain controlled stage as a function of the AGC voltage.

Gating "on" and "off" of the amplifier circuit is accomplished through control of the AGC control circuit's current source transistor 196 by the gate signal from gate source 153. Thus, the amplifier is gated "on" with an enabling voltage $v_1$ applied to the base of transistor 196 for placing the transistor in its conducting state and providing an AGC operation of the circuit as above described. The amplifier is gated "off" with a disabling voltage $v_o$ applied to the base of transistor 196 which places the transistor in its nonconducting state so that no current can flow into conductor 200 and the current source transistors of the gain controlled stages are also made nonconducting. During the gated "off" periods, reverse biased semiconductor junctions are presented to the bias voltage across capacitor 82, in particular, at the bases of transistors 86, 98, 104, 110 and 116 and at the collectors of transistors 124 and 134. Hence, the amount of discharge of capacitor 82 between gated "on" periods is negligible.

In the previously referenced exemplary embodiment of the invention the following circuit components and values were employed, which are given primarily for purposes of illustration and are not intended to be limiting of the claimed invention:

| | | |
|---|---|---|
| Transistors | 84, 86, 88, 96, 98 100, 102, 104, 106 108, 110, 112, 114, 116, 118, 132, 134 138, 140, 148, 156, 158, 162, 164, 176, 178, 180, 190, 194 and 196 | Minimum Geometry NPN |
| | 130, 170 and 186 | Minimum Geometry Lateral PNP |
| | 124 and 128 | Double Collector, Two Times Minimum Geometry Lateral PNP |
| | 198 | Quadruple Collector, four Times Minimum Geometry PNP |
| Diodes | 94, 99, 105, 111, 136, 150, 155, 157, 166 and 202 | Minimum Geometry NPN |
| Resistors | 89, 101, 107, 113, 120 and 204 | 1 Kohm |
| | 92, 97, 103, 109, 122 and 126 | 5 Kohms |
| | 151 | 35 Kohms |
| | 168 | 680 Kohms |
| | 173 and 189 | 10 Mohms |
| | 182 | 4.5 Kohms |
| Capacitors | 74 | 2000 pf |
| | 82 | .15 $\mu f$ |
| | 172 | .01 $\mu f$ |
| | 188 | 10 $\mu f$ |
| | 154 | 550 pf |
| Voltage Source | B+ | +9V |
| | 153 | $V_o = 0V, V_1 = +1.4V$ |

| | -continued | |
|---|---|---|
| Inductor | 80 | 16 mH |
| | 152 | 48 mH |

While the invention has been described with respect to a specific embodiment thereof for the purpose of clear and complete disclosure, it may be appreciated that ones skilled in the art may make numerous changes and modifications to the disclosed circuit without exceeding the basic teaching provided herein. Accordingly, the appended claims are to be construed as embodying all such changes and modifications that fairly fall within the true scope and meaning of the invention.

What I claim as new and desire to secure as Letters Patent of the United States is:

1. An amplifier circuit in the form of a cascade arrangement of amplification stages each including a differentially connected pair of first and second transistors, said circuit comprising:
   (a) an input stage, at least one intermediate stage, and an output stage,
   (b) input means for applying an ac input signal to the first transistor of said input stage,
   (c) dc feedback means including an ac bypass capacitor across which is established a dc bias voltage and a dc bus coupling the dc bias voltage across said capacitor to the second transistor of each stage of said amplifier circuit for providing optimum amplifier gain characteristics,
   (d) said dc feedback means further including bias control means having a first current path responsive to current flowing in the first transistor of said output stage for providing charge current to said capacitor, and a second current path responsive to current flowing in the second transistor of said output stage for providing discharge current for said capacitor, the voltage across said capacitor being substantially constant when said charge and discharge currents are equal for establishing a stable dc bias condition.

2. An amplifier circuit as in claim 1 that is normally operated in a gated "on-off" mode in which said bias control means is constructed to be a current source means for said capacitor during periods when said amplifier circuit is gated "on" and a high impedance during periods when said amplifier circuit is gated "off".

3. An amplifier circuit as in claim 2 in which said first current path includes a first current mirror semiconductor means coupled to the first transistor of said output stage so as to conduct current substantially equal to current flowing in said first transistor and in a given direction with respect to said capacitor, and said second current path includes a second current mirror semiconductor means coupled through an auxiliary current path of said dc feedback means to the second transistor of said output stage so as to conduct current substantially equal to current flowing in said auxiliary current path and in said second transistor and in a direction opposite to that of said given direction with respect to said capacitor.

4. An amplifier circuit as in claim 3 in which said auxiliary current path includes a third current mirror semiconductor means coupled to the second transistor of said output stage so as to conduct current substantially equal to current flowing in said second transistor.

5. An amplifier circuit as in claim 4 in which said auxiliary current path includes a further transistor coupled in cascode with said third semiconductor means so that substantially equal voltages can be established across said first and third semiconductor means.

6. An amplifier circuit as in claim 5 in which said second semiconductor means is coupled in a Wilson circuit arrangement with respect to said auxiliary current path so that the proper voltage conditions can be established across said capacitor.

7. An amplifier circuit as in claim 6 in which said first, second and third semiconductor means comprise transistor devices.

8. An amplifier circuit as in claim 7 in which the differentially connected pair of transistors of said amplification stages are connected to current source transistors for controlling the transconductance of each stage.

9. An amplifier circuit as in claim 8 further comprising:
   (a) AGC control means for coupling an AGC signal to said current source transistors for controlling the transconductance of each stage as a function of said AGC signal, and
   (b) gate control means for applying a gate control signal for gating "on-off" said current source transistors and thereby controlling the gated operation of said amplifier circuit.

10. An amplifier circuit as in claim 9 in which said input and intermediate stages have single ended output connections and said final stage has a balanced circuit configuration and a differential output connection providing the input to a final amplification stage of constant gain.

11. An amplifier circuit in the form of a cascade arrangement of amplification stages each including a differentially connected pair of first and second transistors, said circuit comprising:
   (a) an input stage and at least one other stage,
   (b) input means for applying an ac input signal to the base of the first transistor of said input stage,
   (c) a dc bus coupled to the base of the second transistor of each stage of said amplifier circuit,
   (d) a capacitor coupled to said dc bus for providing a virtual ac ground to the base of each second transistor, said signal creating an ac imbalance between the first and second transistor of each stage, and
   (e) dc feedback means coupled to said dc bus comprising bias control means for simultaneously charging and discharging said capacitor by currents respectively responsive to the currents flowing in said first and second transistors of said other stage, said charging and discharging currents being in a sense to achieve dc balance between the first and second transistors of said amplification stages.

12. An amplifier circuit as in claim 11 which is normally operated in a gated "on-off" mode in which said bias control means includes a current source and a current sink for respectively charging and discharging said capacitor during periods when said amplifier circuit is gated "on", said current source and said current sink having a high impedance, zero current condition, during periods when said amplifier circuit is gated "off", to retain the charge on said capacitor and thereby maintain dc balance throughout gated operation.

13. An amplifier circuit as in claim 11 in which said bias control means includes a first current path responsive to current flowing in the first transistor of said other stage for providing charge current to said capacitor, and a second current path responsive to current flowing in the second transistor of said other stage for providing discharge current to said capacitor, the voltage across said capacitor being substantially constant when said charge and discharge currents are equal for establishing said stable bias condition.

14. An amplifier circuit as in claim 13 in which said first and second current paths include semiconductor components providing reversed bias junctions during gated "off" periods.

15. An amplifier circuit as in claim 14 in which said first current path is arranged in a single current mirror configuration with the first transistor of said stage for providing current flow in a given direction with respect to said capacitor, and said second current path is arranged in a double current mirror configuration with the second transistor of each said other stage for providing current flow in a direction opposite to that of said given direction with respect to said capacitor.

16. An amplifier circuit as in claim 15 in which the differentially connected pair of transistors of said amplification stages are connected to current source transistors for controlling the transconductance of each stage.

17. An amplifier circuit as in claim 16 further comprising:
   (a) AGC control means for coupling an AGC signal to said current source transistors for controlling the transconductance of each stage as a function of said AGC signal, and
   (b) gate control means for applying a gate control signal for gating "on-off" said current source transistors and thereby controlling the gated operation of said amplifier circuit.

\* \* \* \* \*